United States Patent
Li et al.

(10) Patent No.: US 9,269,770 B2
(45) Date of Patent: Feb. 23, 2016

(54) INTEGRATED CIRCUIT SYSTEM WITH DOUBLE DOPED DRAIN TRANSISTOR

(75) Inventors: Yisuo Li, Singapore (SG); Gang Chen, Boise, ID (US); Francis Benistant, Singapore (SG); Purakh Raj Verma, Singapore (SG); Hong Yang, Singapore (SG); Shao-fu Sanford Chu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 1339 days.

(21) Appl. No.: 11/683,655

(22) Filed: Mar. 8, 2007

(65) Prior Publication Data

US 2007/0210376 A1 Sep. 13, 2007

Related U.S. Application Data

(60) Provisional application No. 60/767,205, filed on Mar. 10, 2006.

(51) Int. Cl.
*H01L 29/66* (2006.01)
*H01L 29/08* (2006.01)
*H01L 29/78* (2006.01)
*H01L 29/739* (2006.01)

(52) U.S. Cl.
CPC ........ *H01L 29/0847* (2013.01); *H01L 29/7833* (2013.01); *H01L 29/0843* (2013.01); *H01L 29/6659* (2013.01); *H01L 29/66681* (2013.01); *H01L 29/7393* (2013.01); *H01L 29/7816* (2013.01)

(58) Field of Classification Search
CPC ............ H01L 29/0847; H01L 29/7393; H01L 29/7833; H01L 29/0843; H01L 29/6659; H01L 29/7816; H01L 29/66681
USPC .................. 257/341, 342, 350, 335, 337, 339, 257/E21.147, 141, 323, 556, 565, E29.12, 257/E29.187, E29.261, E29.027, E29.256; 438/197, 202, 234
See application file for complete search history.

(56) References Cited

U.S. PATENT DOCUMENTS

| | | | |
|---|---|---|---|
| 3,883,372 A * | 5/1975 | Lin ............................ | 438/286 |
| 5,264,719 A * | 11/1993 | Beasom .................... | 257/335 |
| 5,444,271 A | 8/1995 | Kuwahara | |
| 5,510,281 A * | 4/1996 | Ghezzo et al. ............ | 438/268 |
| 5,595,919 A * | 1/1997 | Pan .......................... | 438/302 |
| 5,675,166 A * | 10/1997 | Ilderem et al. ............ | 257/345 |
| 5,684,319 A * | 11/1997 | Hebert ...................... | 257/336 |
| 5,920,774 A * | 7/1999 | Wu ........................... | 438/224 |
| 6,211,023 B1 * | 4/2001 | Yeh et al. .................. | 438/299 |
| 6,239,463 B1 * | 5/2001 | Williams et al. .......... | 257/328 |
| 6,399,468 B2 | 6/2002 | Nishibe et al. | |
| 6,426,258 B1 * | 7/2002 | Harada et al. ............. | 438/268 |
| 6,559,504 B2 | 5/2003 | Nishibe et al. | |
| 6,667,513 B1 * | 12/2003 | Skotnicki et al. ......... | 257/335 |
| 6,693,339 B1 * | 2/2004 | Khemka et al. ........... | 257/492 |
| 6,909,143 B2 * | 6/2005 | Jeon et al. ................. | 257/335 |

(Continued)

*Primary Examiner* — Galina Yushina
(74) *Attorney, Agent, or Firm* — Ishimaru & Associates LLP

(57) ABSTRACT

An integrated circuit system includes a substrate, forming a gate over the substrate, forming a first drift region having a first counter diffused region and a source diffused region, the first drift region in the substrate adjacent a first side of the gate, and forming a second drift region having a second counter diffused region and a drain diffused region, the second drift region in the substrate adjacent a second side of the gate opposite the first side of the gate.

20 Claims, 5 Drawing Sheets

(56) References Cited

U.S. PATENT DOCUMENTS

| | | | |
|---|---|---|---|
| 7,335,543 B2 * | 2/2008 | Chen et al. | 438/197 |
| 7,405,117 B2 * | 7/2008 | Zuniga et al. | 438/197 |
| 2002/0038891 A1 * | 4/2002 | Ryu et al. | 257/350 |
| 2004/0217417 A1 | 11/2004 | Lee | |
| 2005/0287753 A1 | 12/2005 | Chen et al. | |

* cited by examiner

INTEGRATED CIRCUIT SYSTEM WITH DOUBLE DOPED DRAIN TRANSISTOR

CROSS-REFERENCE TO RELATED APPLICATION(S)

This application claims the benefit of U.S. Provisional Patent Application Ser. No. 60/767,205 filed Mar. 10, 2006.

TECHNICAL FIELD

The present invention relates to the field of semiconductor manufacturing, and more specifically to metal oxide semiconductor (MOS) transistor structures.

BACKGROUND ART

Integrated circuits are often manufactured in and on silicon and other semiconductor wafers. Such integrated circuits include literally millions of metal oxide semiconductor (MOS) field effect transistors, having gate lengths on the order of 0.05 microns. Such MOS transistors may include p-channel MOS (PMOS) transistors, and n-channel MOS (NMOS) transistors, depending on their dopant conductivity types.

Wafers are obtained by drawing an ingot of silicon out of a liquid silicon bath. The ingot is made of mono-crystalline (single-crystal) silicon, and is subsequently sawed into individual wafers. A layer of silicon is then deposited over each wafer. Because the wafer is made of mono-crystalline silicon, the deposition conditions can be controlled so that the layer of silicon deposits "epitaxially" over the wafer. "Epitaxy" refers to the manner in which the silicon layer deposits on the wafer. The layer of silicon has a lattice structure, which further follows the structure of the lattice of the mono-crystalline silicon of the wafer. The layer of silicon is also substantially the same material as the mono-crystalline silicon of the wafer, so that the lattice of the silicon layer also has substantially the same spacing as the spacing of the lattice of the mono-crystalline silicon of the wafer.

A gate dielectric layer, a gate electrode, and spacers are subsequently formed on the layer of silicon. Ions are also implanted into the layer of silicon, which form source and drain regions on opposing sides of the gate electrode. A voltage can be applied over the source and drain regions. Current flows from the source region to the drain region through a channel below the gate dielectric layer when a voltage is applied to the gate electrode.

Recent application of high voltage technologies for LCD (Liquid Crystal Display) driver market demands high voltage (6-40V range) transistors with minimum transistor pitch. Reduction of pitch poses serious concerns on transistor's HCI (hot-carrier injection) lifetime. HCI is a phenomenon by which the kinetic energy of the carriers (holes or electrons) is increased as they are accelerated through large potential gradients and subsequently become trapped within the gate oxide. The greatest potential gradient, or maximum electric field, occurs near the drain during saturated operation. More specifically, the electric field is predominant at the lateral junction of the drain adjacent the channel.

For example in n-channel devices, the electric field at the drain causes channel electrons to gain kinetic energy. Electron-electron scattering randomizes the kinetic energy and the electrons become "hot". Some of these hot electrons have enough energy to create electron-hole pairs through impact ionization of the silicon atoms. Electrons generated by impact ionization join the flow of channel electrons, while the holes flow into the bulk to produce a substrate current in the device. The substrate current is the first indication of the creation of hot carriers in a device. For p-channel devices, the fundamentals of the process are essentially the same except that the role of holes and electrons are reversed.

HCI occurs when some of the hot carriers are injected into the gate oxide near the drain junction, where they induce damage and become trapped. Traps within the gate oxide generally become electron traps, even if they are initially filled with holes. As a result, there is a negative charge density in the gate oxide. The trapped charge accumulates with time, resulting in positive threshold shifts in both n-channel and p-channel devices. It is known that since hot electrons are more mobile than hot holes, HCI causes a greater threshold skew in n-channel devices than p-channel devices.

Unless modifications are made to the transistor structure, problems of sub-threshold current and threshold shift resulting from SCE (short-channel effects) and HCI will remain. To overcome these problems, alternative drain structures such as double-diffused drains (DDDs) and lightly doped drains (LDDs) must be used. The purpose of both types of structures is the same: to absorb some of the potential into the drain and thus reduce the maximum electric field. The popularity of DDD structures has given way to LDD structures since DDD causes unacceptably deep junctions and deleterious junction capacitance.

There appears to be no way to reduce the size of high voltage semiconductor devices, such as DDD MOS transistors or to reduce substrate current and increase lifetime of the transistors.

Thus, a need still remains for an integrated circuit system to lower costs with lower substrate currents, improved lifetime, reduced thermal cycles, and greater packaging densities, to provide and support systems that are capable of achieving optimal thin, high-density footprint semiconductor systems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a substrate, forming a gate over the substrate, forming a first drift region having a first counter diffused region and a source diffused region, the first drift region in the substrate adjacent a first side of the gate, and forming a second drift region having a second counter diffused region and a drain diffused region, the second drift region in the substrate adjacent a second side of the gate opposite the first side of the gate.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
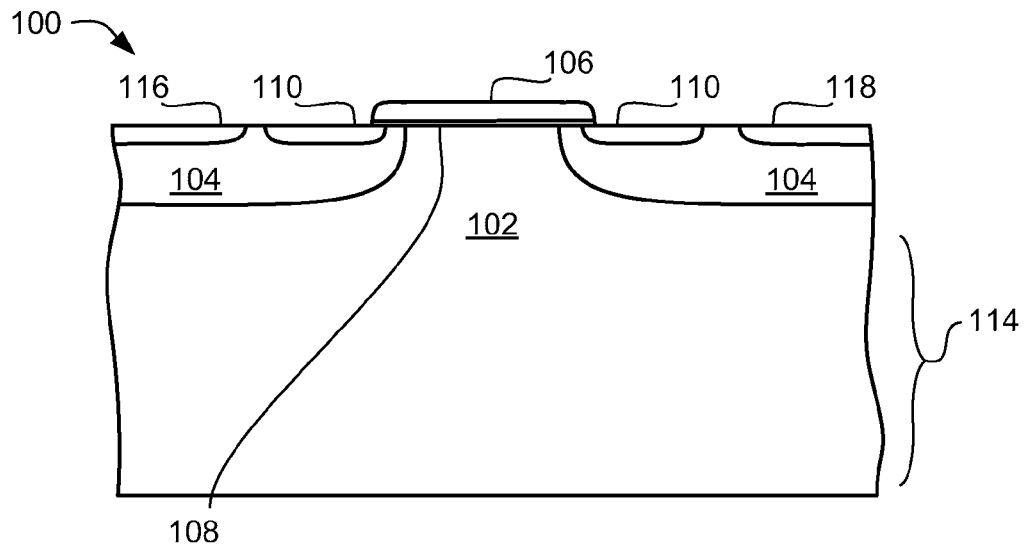
FIG. 1 is a cross-sectional view of an integrated circuit system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on" "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is a cross-sectional view of an integrated circuit system 100. The integrated circuit system 100 can include a substrate 102, such as a P-type body, with drift regions 104, such as N-type regions. The integrated circuit system 100 can include a gate 106 over a gate insulator 108 preferably formed over a region between the drift regions 104. The gate insulator 108 or the gate 106 can overlap the drift regions 104. The integrated circuit system 100 can also include counter diffused regions 110, such as a P+ counter doped regions, to form bipolar-like junction structures.

The counter diffused regions 110 can be formed in the drift regions 104 adjacent or near the gate insulator 108 and the gate 106. An edge of the counter diffused regions 110 near the gate insulator 108 can preferably provide spacing to an edge of the drift regions 104 also near the gate insulator 108. The counter diffused regions 110 can be formed to a depth less than a depth of the drift regions 104 such that current flows through the drift regions 104 and a bulk region 114 of the substrate 102.

The counter diffused regions 110 can preferably be formed to a depth of between approximately one-tenth of a micron (0.1 um) to approximately three-tenths of a micron (0.3 um) for the integrated circuit system 100 optionally formed as an N-type device, such as an N-type double-diffused drain (NDDD) transistor. The depth of the counter diffused regions 110 can be too shallow resulting in substantially no improvement in lifetime of the integrated circuit system 100 or substantially no improvement in device pitch. The counter diffused regions 110 can preferably have a dopant concentration approximately an order of magnitude less than a dopant concentration of the drift regions 104. The dopant concentration of the counter diffused regions 110 can be too high resulting in a decrease in drive current due in part to recombination effects.

For an N-type device, the counter diffused regions 110 can be formed with a dopant, such as Boron BF2 Indium. The dopant, such as Boron or compound thereof, can form the counter diffused regions 110 with implant energy between approximately ten thousand electronvolts (10 keV) and approximately fifty thousand electronvolts (50 keV), preferably thirty thousand electronvolts (30 keV). A dose of the dopant, such as Boron or compound thereof, between approximately five hundred billion ions per square centimeter (5 E11) to approximately three trillion ions per square centimeter (3 E12), preferably one trillion ions per square centimeter (1 E12), can form the counter diffused regions 110. For a P-type device, such as a P-type double-diffused drain (PDDD) transistor, the counter diffused regions 110 can be formed with a dopant, such as Phosphorus, Arsenic, or Antimony.

The integrated circuit system 100 can further include a source diffused region 116, such as an N-type doped region, and a drain diffused region 118, such as an N-type doped region. The source diffused region 116 and the drain diffused region 118 are formed in the drift regions 104, separated from the counter diffused regions 110, and near a side of the counter diffused regions 110 further from the gate 106. The source diffused region 116 and the drain diffused region 118 can preferably be formed having a higher dopant concentration than the drift regions 104 to provide an electrical contact area. For illustrative purposes, the integrated circuit system 100 is shown as an N-type field-effect transistor (NMOS FET) although it is understood that other configurations, such as a P-type field-effect transistor (PMOS FET) may also be used.

It has been discovered that the integrated circuit system 100 increases a path for carrier injection between the source diffused region 116 and the drain diffused region 118 thereby providing lower substrate current, improved lifetime, such as hot carrier injection (HCI) lifetime, reduced thermal cycles including impact on adjacent lower voltage transistors, and higher packing density, such as reducing device size or pitch.

Figure 2:
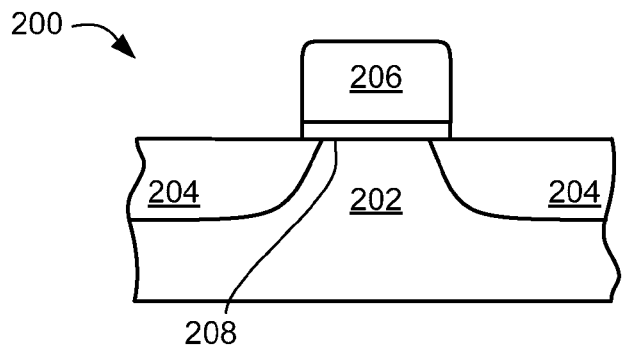
FIG. 2 is a cross-sectional view of an integrated circuit system in a gate forming phase in an alternative embodiment of the present invention.

Referring now to FIG. 2, therein is shown a cross-sectional view of an integrated circuit system 200 in a gate forming phase in an alternative embodiment of the present invention. Similar to the integrated circuit system 100, the integrated circuit system 200 can include can include a substrate 202, such as a P-type body, with drift regions 204, such as N-type regions. The integrated circuit system 200 can also include a gate 206 over a gate insulator 208 preferably formed over a region between the drift regions 204. The gate insulator 208 or the gate 206 can overlap the drift regions 204.

Figure 3:
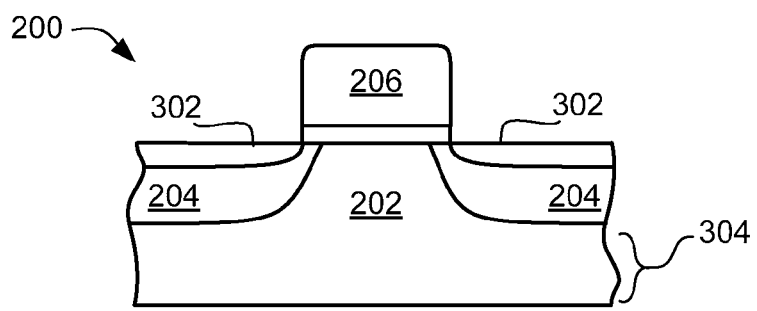
FIG. 3 is the structure of FIG. 2 in a double diffusion forming phase.

Referring now to FIG. 3, therein is shown the structure of FIG. 2 in a double diffusion forming phase. The integrated circuit system 200 can also include counter diffused regions 302, such as a P+ counter doped regions, to form bipolar-like junction structures. The counter diffused regions 302 can preferably be formed, such as self-aligned, over the gate 206 providing alignment to outer vertical edges of the gate 206. The counter diffused regions 302 can be formed to a depth less than a depth of the drift regions 204 such that current flows through the drift regions 204 and a bulk region 304 of the substrate 202.

Figure 4:
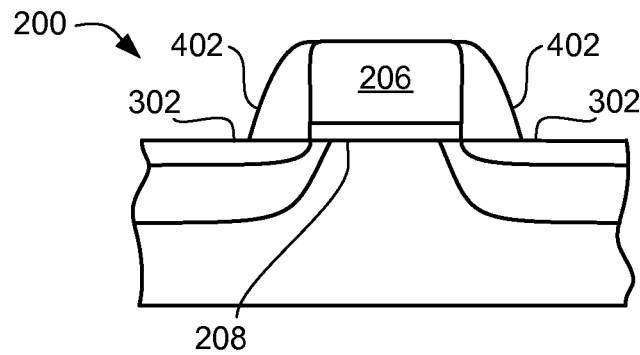
FIG. 4 is the structure of FIG. 3 in a spacer forming phase.

Referring now to FIG. 4, therein is shown the structure of FIG. 3 in a spacer forming phase. The integrated circuit system 200 can include spacers 402, such as an oxide or other insulator. The spacers 402 can be formed adjacent outer vertical edges of the gate 206 and outer vertical edges of the gate insulator 208. A junction region of each of the counter diffused regions 302 can preferably be covered by the spacers 402. The spacers 402 can provide isolation of the junction region of each of the counter diffused regions 302 for further processing.

Figure 5:
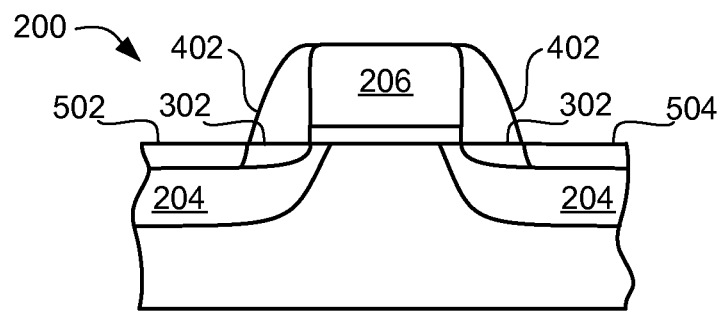
FIG. 5 is the structure of FIG. 4 in a source and drain forming phase n.

Referring now to FIG. 5, therein is shown the structure of FIG. 4 in a source and drain forming phase. The integrated circuit system 200 can include a source diffused region 502, such as an N-type doped region, and a drain diffused region 504, such as an N-type doped region. The source diffused region 502 and the drain diffused region 504 can be formed adjacent to the counter diffused region 302 protected by the spacers 402 and optionally a resist layer (not shown) such as a photoresist. The resist layer can provide additional area beyond the spacers 402 for the counter diffused regions 302. The source diffused region 502 and the drain diffused region 504 can be formed in the drift regions 204 and spaced away from the gate 206 and preferably having a higher dopant concentration than the drift regions 204 to provide an electrical contact area. A top surface of the substrate 202 of FIG. 2 can be coplanar with the drift region 204, the counter diffused regions 302, the source diffused region 502, and the drain diffused region 504.

Figure 6:
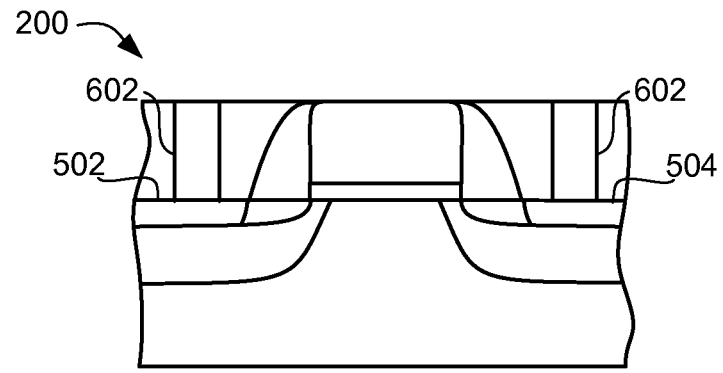
FIG. 6 is a cross-sectional view of the integrated circuit system.

Referring now to FIG. 6, therein is shown a cross-sectional view of the integrated circuit system 200. The integrated circuit system 200 can includes connectors 602, such as metal contacts. The connectors 602 can provide electrical contact to the source diffused region 502 or the drain diffused region 504 and thereby the source terminal or drain terminal of the device, such as a metal-oxide-semiconductor field-effect transistor (MOSFET).

For illustrative purposes, the integrated circuit system 200 is shown as an N-type double-diffused drain transistor (NDDD) although it is understood that other configurations, such as a P-type double-diffused drain transistor (PDDD) may be used.

Figure 7:
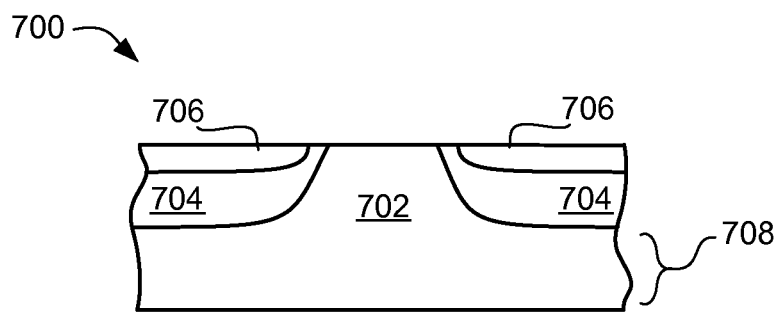
FIG. 7 is a cross-sectional view of an integrated circuit system in a double diffusion forming phase in another alternative embodiment of the present invention.

Referring now to FIG. 7, therein is shown a cross-sectional view of an integrated circuit system 700 in a double diffusion forming phase in another alternative embodiment of the present invention. Similar to the integrated circuit system 100, the integrated circuit system 700 can include can include a substrate 702, such as a P-type body, with drift regions 704, such as N-type regions. The integrated circuit system 700 can also include counter diffused regions 706, such as a P+ counter doped regions, to form bipolar-like junction structures. The counter diffused regions 706 can preferably be formed to a depth less than a depth of the drift regions 704 such that current flows through the drift regions 704 and a bulk region 708 of the substrate 702.

Figure 8:
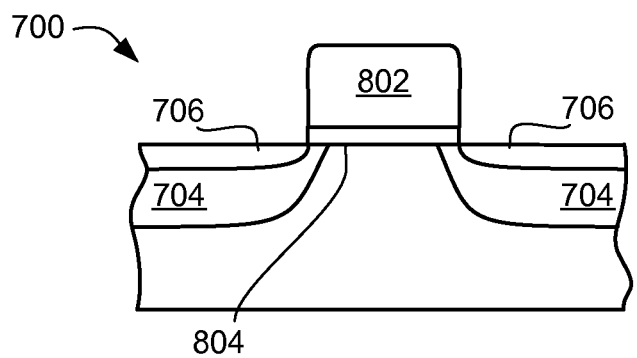
FIG. 8 is the structure of FIG. 7 in a gate forming phase.

Referring now to FIG. 8, therein is shown the structure of FIG. 7 in a gate forming phase. The integrated circuit system 700 can include a gate 802 over a gate insulator 804 preferably formed, such as non-self-aligned, over a region between the drift regions 704 and the counter diffused regions 706. The gate insulator 804 or the gate 802 can overlap the drift regions 704 and provide outer vertical edges of the gate 802 or outer vertical edges of the gate insulator 804 substantially aligned to inner extents of the counter diffused regions 706.

Figure 9:
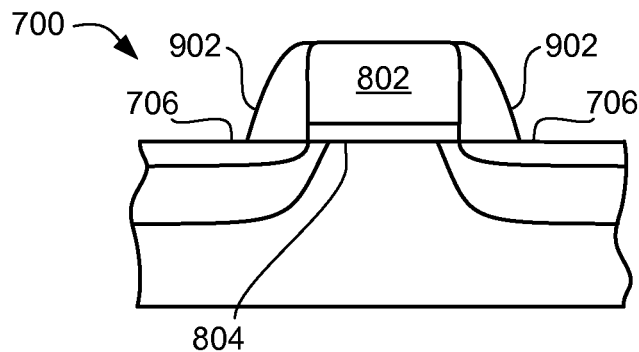
FIG. 9 is the structure of FIG. 8 in a spacer forming phase.

Referring now to FIG. 9, therein is shown the structure of FIG. 8 in a spacer forming phase. The integrated circuit system 200 can include spacers 902, such as an oxide or other insulator. The spacers 902 can be formed adjacent outer vertical edges of the gate 802 and outer vertical edges of the gate insulator 804. A junction region of each of the counter diffused regions 706 can preferably be covered by the spacers 902. The spacers 902 can provide isolation of the junction region of each of the counter diffused regions 706 for further processing.

Figure 10:
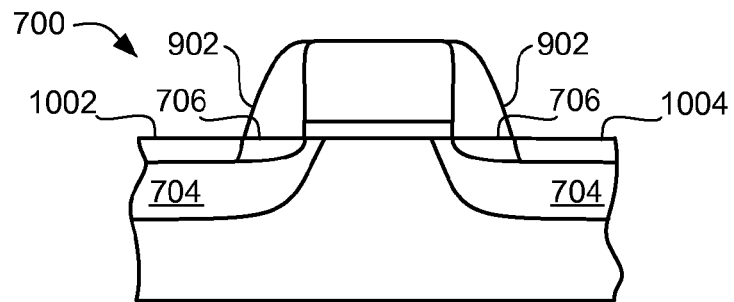
FIG. 10 is the structure of FIG. 9 in a source and drain forming phase.

Referring now to FIG. 10, therein is shown the structure of FIG. 9 in a source and drain forming phase. The integrated circuit system 700 can include a source diffused region 1002, such as an N-type doped region, and a drain diffused region 1004, such as an N-type doped region. The source diffused region 1002 and the drain diffused region 1004 can optionally be formed adjacent a resist layer (not shown) such as a photoresist. The resist layer can provide additional area beyond the spacers 902 for the counter diffused regions 706. The source diffused region 1002 and the drain diffused region 1004 can preferably be formed having a higher dopant concentration than the drift regions 704 to provide an electrical contact area.

Figure 11:
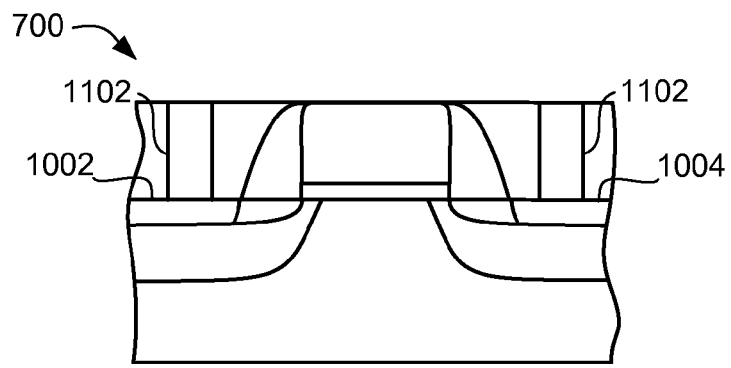
FIG. 11 is a cross-sectional view of the integrated circuit system.

Referring now to FIG. 11, therein is shown a cross-sectional view of the integrated circuit system 700. The integrated circuit system 700 can includes connectors 1102, such as metal contacts. The connectors 1102 can provide electrical contact to the source diffused region 1002 or the drain diffused region 1004 and thereby the source terminal or drain terminal of the device, such as a metal-oxide-semiconductor field-effect transistor (MOSFET).

For illustrative purposes, the integrated circuit system 700 is shown as an N-type double-diffused drain transistor (NDDD) although it is understood that other configurations, such as a P-type double-diffused drain transistor (PDDD) may be used.

Figure 12:
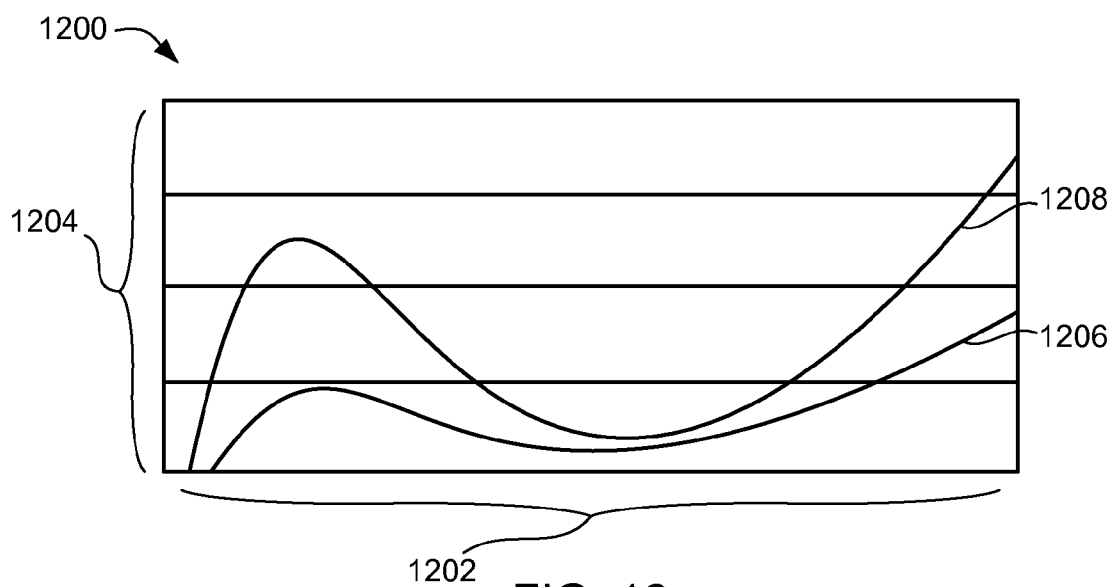
FIG. 12 is a substrate current graph.

Referring now to FIG. 12, therein is shown a substrate current graph 1200. The substrate current graph 1200 includes gate voltages 1202 and substrate currents 1204. A first plot 1206 of the substrate currents 1204 shown based on the gate voltages 1202 of the integrated circuit system 100 are significantly lower than a second plot 1208 of the substrate currents 1204 based on the gate voltages 1202 of an other structure (not shown), such as a conventional MOSFET. Hot carrier injection (HCI) lifetime based on the substrate current graph can be approximately two and two hundred fifty-two thousandths (2.252) years for the integrated circuit system 100 resulting in approximately one thousand times improvement over the other structure.

Figure 13:
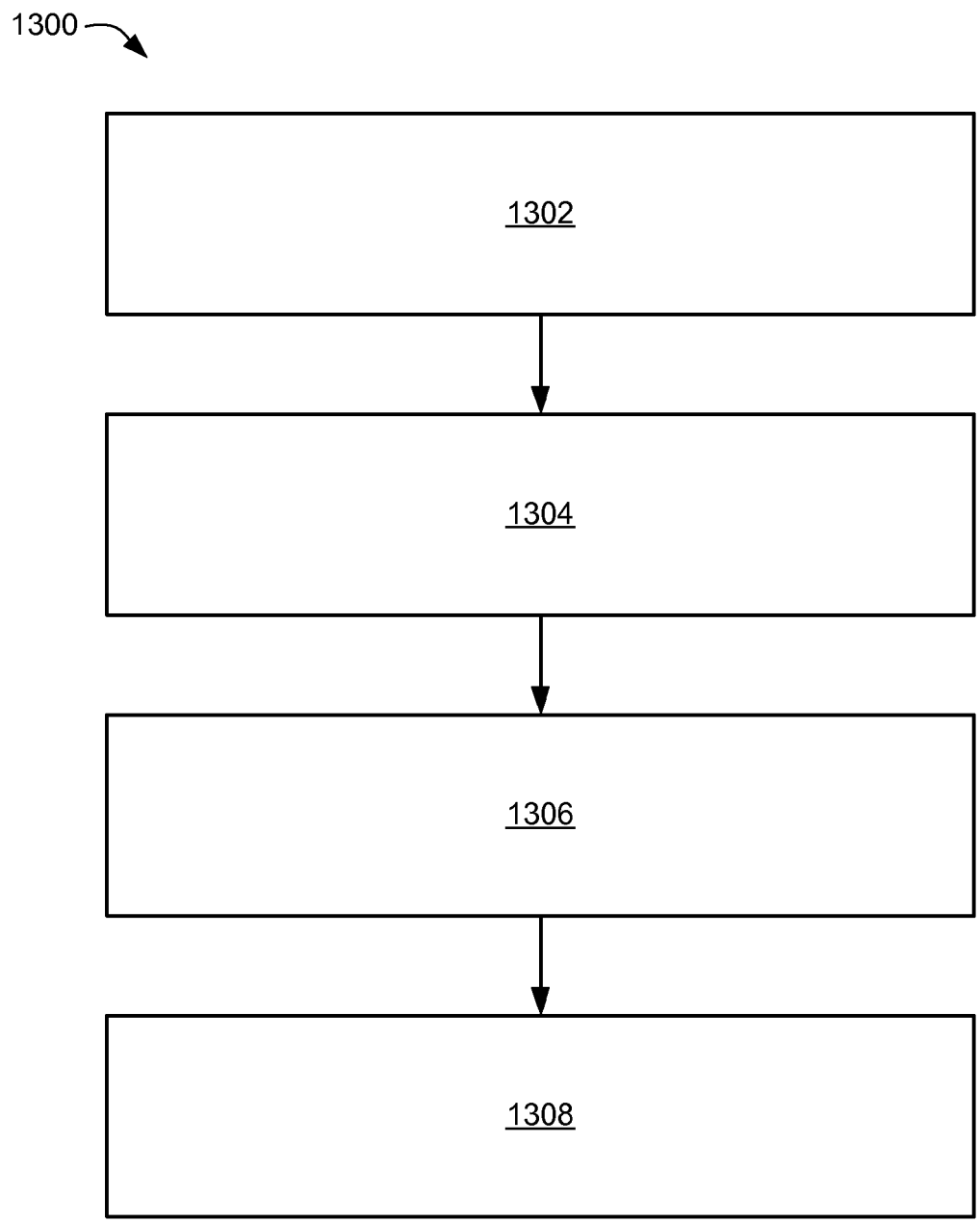
FIG. 13 is a flow chart of an integrated circuit system for manufacturing the integrated circuit system in an embodiment of the present invention.

Referring now to FIG. 13, therein is shown a flow chart of an integrated circuit system 1300 for manufacturing the integrated circuit system 100 in an embodiment of the present invention. The system 1300 includes providing a substrate in a block 1302; forming a gate over the substrate in a block 1304; forming a first drift region having a first counter diffused region and a source diffused region, the first drift region in the substrate adjacent a first side of the gate in a block 1306; and forming a second drift region having a second counter diffused region and a drain diffused region, the second drift region in the substrate adjacent a second side of the gate opposite the first side of the gate in a block 1308.

In greater detail, a system to provide the method and apparatus of the integrated circuit system 100, in an embodiment of the present invention, is performed as follows:

1. Providing a substrate having a bulk region.
2. Forming a gate with a gate insulator over the substrate.
3. Forming a first drift region in the substrate adjacent a first side of the gate.
4. Forming a second drift region in the substrate adjacent a second side of the gate opposite the first side of the gate.
5. Forming a first counter diffused region in the first drift region adjacent the first side of the gate.
6. Forming a second counter diffused region in the second drift region adjacent the second side of the gate.
7. Forming a source diffused region in the first drift region adjacent a side of the first counter diffused region opposite the gate.
8. Forming a drain diffused region in the second drift regions adjacent a side of the second counter diffused region opposite the gate.

Thus, it has been discovered that the integrated circuit system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacturing an integrated circuit comprising:
    providing a substrate;
    forming a gate over the substrate;
    forming a first drift region in the substrate adjacent to a first side of the gate;
    forming a first counter diffused region, to a depth less than a depth of the first drift region, for forming a bipolar-like junction with the first drift region; and
    forming a source diffused region, in the first drift region and separated from the first counter diffused region, near a side of the first counter diffused region located further from the gate.

2. The method as claimed in claim 1 further comprising flowing current through the first drift region and a bulk region of the substrate.

3. The method as claimed in claim 1 wherein forming the first counter diffused region includes doping the first drift region and the gate.

4. The method as claimed in claim 1 wherein forming the first counter diffused region includes doping the first drift region.

5. The method as claimed in claim 1 wherein forming the first counter diffused region includes forming the first counter diffused region at a depth approximately half a depth of the first drift region.

6. A method of manufacturing an integrated circuit comprising:
    providing a substrate having a bulk region;
    forming a gate with a gate insulator over the substrate;
    forming a first drift region in the substrate adjacent a first side of the gate;
    forming a second drift region in the substrate adjacent a second side of the gate opposite the first side of the gate;
    forming a first counter diffused region in the first drift region, to a depth less than a depth of the first drift region, for forming a bipolar-like junction with the first drift region;
    forming a second counter diffused region, in the second drift region, adjacent the second side of the gate for forming the bipolar-like junction with the second drift region;
    forming a source diffused region, in the first drift region, adjacent a side of the first counter diffused region opposite the first side of the gate; and
    forming a drain diffused region, in the second drift region and separated from the first counter diffused region, near a side of the second counter diffused region located further from the gate.

7. The method as claimed in claim 6 wherein forming the first counter diffused region includes forming the first counter diffused region to a depth of approximately one-tenth of a micron to three-tenths of a micron.

8. The method as claimed in claim 6 wherein forming the first counter diffused region includes boron or a compound thereof.

9. The method as claimed in claim 6 wherein forming the first counter diffused region includes phosphorus, arsenic, antimony, or a compound thereof.

10. The method as claimed in claim 6 wherein forming the first counter diffused region includes forming the first counter diffused region with a dopant concentration approximately an order of magnitude less than a dopant concentration of the first drift region.

11. An integrated circuit system comprising:
    a substrate;
    a gate over the substrate;
    a first drift region formed in the substrate adjacent to a first side of the gate;
    a first counter diffused region formed in the first drift region, to a depth less than a depth of the first drift region, to form a bipolar-like junction with the first drift region; and
    a source diffused region, formed in the first drift region and separated from the first counter diffused region, near a side of the first counter diffused region located further from the gate.

12. The system as claimed in claim 11 wherein the first counter diffused region includes the first counter diffused region at a depth approximately half a depth of the first drift region.

13. The system as claimed in claim 11 further comprising the first drift region and a bulk region of the substrate for current flow.

14. The system as claimed in claim 11 wherein the first drift region surrounds the first counter diffusion region formed by a dopant in the first drift region and self-aligned to the gate.

15. The system as claimed in claim 11 wherein the source diffused region is formed by a dopant in the first drift region.

16. The system as claimed in claim 11 further comprising:
a bulk region in the substrate;
a gate insulator over the substrate;
a second drift region formed in the substrate adjacent to a second side of the gate opposite the first side of the gate;
a second counter diffused region, formed in the second drift region, adjacent the second side of the gate to form the bipolar-like junction with the second drift region; and;
a drain diffused region, formed in the second drift region and separated from the second counter diffused region, near a side of the second counter diffused region located further from the gate.

17. The system as claimed in claim 16 wherein the first counter diffused region includes the first counter diffused region to a depth of approximately one-tenth of a micron to three-tenths of a micron.

18. The system as claimed in claim 16 wherein the first counter diffused region includes boron or a compound thereof.

19. The system as claimed in claim 16 wherein the first counter diffused region includes phosphorus, arsenic, antimony, or a compound thereof.

20. The system as claimed in claim 16 wherein the first counter diffused region includes the first counter diffused region with a dopant concentration approximately an order of magnitude less than a dopant concentration of the first drift region.

* * * * *